(12) United States Patent
Nicholas

(10) Patent No.: US 8,150,672 B2
(45) Date of Patent: *Apr. 3, 2012

(54) STRUCTURE FOR IMPROVED LOGIC SIMULATION USING A NEGATIVE UNKNOWN BOOLEAN STATE

(75) Inventor: Richard Nicholas, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 691 days.

This patent is subject to a terminal disclaimer.

(21) Appl. No.: 12/192,309

(22) Filed: Aug. 15, 2008

(65) Prior Publication Data

US 2008/0300849 A1 Dec. 4, 2008

Related U.S. Application Data

(63) Continuation-in-part of application No. 11/531,708, filed on Sep. 14, 2006, now Pat. No. 7,761,277.

(51) Int. Cl.
*G06F 17/50* (2006.01)

(52) U.S. Cl. ............... 703/14; 703/22; 716/106

(58) Field of Classification Search .................. 703/14, 703/22; 716/106
See application file for complete search history.

(56) References Cited

U.S. PATENT DOCUMENTS

| | | | |
|---|---|---|---|
| 5,801,955 A | 9/1998 | Burgun et al. | 716/6 |
| 6,519,609 B1 | 2/2003 | Touzet | 707/104.1 |
| 7,107,567 B1 | 9/2006 | LeBlanc | 716/17 |
| 7,761,277 B2 * | 7/2010 | Nicholas | 703/14 |

OTHER PUBLICATIONS

Liu et al., "Optimizing Designs Containing Black Boxes," ACM Transactions on Design Automation of Electronic Systems, vol. 6, No. 4, Oct. 2001, pp. 591-601.

* cited by examiner

*Primary Examiner* — Dwin M Craig
(74) *Attorney, Agent, or Firm* — VanLeeuwen & VanLeeuwen; Matthew B. Talpis

(57) ABSTRACT

A system and method for simulating a circuit design using both an unknown Boolean state and a negative unknown Boolean state is provided. When the circuit is simulated, one or more initial simulated logic elements are initialized to the unknown Boolean state. The initialized unknown Boolean states are then fed to one or more simulated logic elements and the simulator simulates the handling of the unknown Boolean state by the simulated logic elements. Examples of simulated logic elements include gates and latches, such as flip-flops, inverters, and basic logic gates. The processing results in at least one negative unknown Boolean state. An example of when a negative unknown Boolean state would result would be when the unknown Boolean state is inverted by an inverter. The resulting negative unknown Boolean state is then fed to other simulated logic elements that generate further simulation results based on processing the negative unknown Boolean state.

16 Claims, 8 Drawing Sheets

Truth Tables for Basic Logic Gates with Respect to Unknown States and Same Source Tags
300

NOT (Inverter) 310

| Input | Result |
|---|---|
| X | -X |
| -X | X |

AND Gate 320

| Inputs | | Result |
|---|---|---|
| X | 0 | 0 |
| -X | 0 | 0 |
| X | 1 | X |
| -X | 1 | -X |
| X | X | X |
| -X | X | 0 |
| X | -X | 0 |
| -X | -X | -X |

OR Gate 330

| Inputs | | Result |
|---|---|---|
| X | 0 | X |
| -X | 0 | -X |
| X | 1 | 1 |
| -X | 1 | 1 |
| X | X | X |
| -X | X | 1 |
| X | -X | 1 |
| -X | -X | -X |

NAND Gate 340

| Inputs | | Result |
|---|---|---|
| X | 0 | 1 |
| -X | 0 | 1 |
| X | 1 | -X |
| -X | 1 | X |
| X | X | -X |
| -X | X | 1 |
| X | -X | 1 |
| -X | -X | X |

NOR Gate 350

| Inputs | | Result |
|---|---|---|
| X | 0 | -X |
| -X | 0 | X |
| X | 1 | 0 |
| -X | 1 | 0 |
| X | X | -X |
| -X | X | 0 |
| X | -X | 0 |
| -X | -X | X |

XOR Gate 360

| Inputs | | Result |
|---|---|---|
| X | 0 | X |
| -X | 0 | -X |
| X | 1 | -X |
| -X | 1 | X |
| X | X | 0 |
| -X | X | 1 |
| X | -X | 1 |
| -X | -X | 0 |

XNOR Gate 370

| Inputs | | Result |
|---|---|---|
| X | 0 | -X |
| -X | 0 | X |
| X | 1 | X |
| -X | 1 | -X |
| X | X | 1 |
| -X | X | 0 |
| X | -X | 0 |
| -X | -X | 1 |

*Fig. 3*

Truth Tables for Basic Logic Gates with Respect to Unknown States and Different Source Tags
400

NOT (Inverter) 410

| Input | Result |
|---|---|
| X | -X |
| -X | X |

AND Gate 420

| Inputs | | Result |
|---|---|---|
| X | 0 | 0 |
| -X | 0 | 0 |
| X | 1 | X |
| -X | 1 | X |
| X | X | X |
| -X | X | X |
| X | -X | X |
| -X | -X | X |

OR Gate 430

| Inputs | | Result |
|---|---|---|
| X | 0 | X |
| -X | 0 | X |
| X | 1 | 1 |
| -X | 1 | 1 |
| X | X | X |
| -X | X | X |
| X | -X | X |
| -X | -X | X |

NAND Gate 440

| Inputs | | Result |
|---|---|---|
| X | 0 | 1 |
| -X | 0 | 1 |
| X | 1 | X |
| -X | 1 | X |
| X | X | X |
| -X | X | X |
| X | -X | X |
| -X | -X | X |

NOR Gate 450

| Inputs | | Result |
|---|---|---|
| X | 0 | X |
| -X | 0 | X |
| X | 1 | 0 |
| -X | 1 | 0 |
| X | X | X |
| -X | X | X |
| X | -X | X |
| -X | -X | X |

XOR Gate 460

| Inputs | | Result |
|---|---|---|
| X | 0 | X |
| -X | 0 | X |
| X | 1 | X |
| -X | 1 | X |
| X | X | X |
| -X | X | X |
| X | -X | X |
| -X | -X | X |

XNOR Gate 470

| Inputs | | Result |
|---|---|---|
| X | 0 | X |
| -X | 0 | X |
| X | 1 | X |
| -X | 1 | X |
| X | X | X |
| -X | X | X |
| X | -X | X |
| -X | -X | X |

STRUCTURE FOR IMPROVED LOGIC SIMULATION USING A NEGATIVE UNKNOWN BOOLEAN STATE

This application is a continuation-in-part application of Ser. No. 11/531,708, now U.S. Pat. No. 7,761,277, entitled "System and Method for Improved Logic Simulation Using a Negative Unknown Boolean State," filed on Sep. 14, 2006.

BACKGROUND OF THE INVENTION

1. Technical Field

The present invention relates to a design structure for improved logic simulation. More particularly, the present invention relates to a design structure for improving logic simulation by using a negative unknown Boolean state that is maintained by the logic simulator.

2. Description of the Related Art

Logic designs described in Register Transfer Level (RTL) code and netlists are typically simulated using logic simulators. Netlists are traditionally created by "synthesizing" the RTL design into circuits that use the library elements of the target technology library, such as basic AND gates, OR gates, flip-flops, and the like. Both the RTL representation of the design as well as the resulting netlist are usually expressed using the same Hardware Description Language (HDL). Examples of Hardware Description Languages include Verilog and VHDL.

Simulators keep track of the "state" of each memory element (such as a latch or flip-flop) and each net in the design. At any given time, a memory element can be in one of a few states. In a traditional simulator, these states include '1', '0', and 'X', where 'X' is an unknown Boolean state that indicates that the value of the logic element is unknown to the simulator. The unknown Boolean state may be indicated in different ways in different simulators. For example, an 'X' state denotes the unknown Boolean state in Verilog, while a 'U' state denotes the unknown Boolean state in VHDL. Despite the differences in notation, most, if not all, simulators accommodate an unknown Boolean state in order to keep track of logic elements that has an unknown Boolean state at a given point in time. The unknown Boolean state is used because it often cannot be known which state (e.g., 0 or 1) any of the numerous logic elements will resolve to when power is applied to the circuit. When a circuit is initially powered on, the value of various logic elements is essentially random (e.g., a given logic element may be in either a high (1) state or a low (0) state, but there is no way of knowing which state (high or low) the logic element initializes to when power is initially applied). Because the design needs to work properly regardless of the initial state of the logic element when power is applied, simulators assign the unknown Boolean state (X) to the logic elements when simulation is commenced.

In most circuits, a reset signal is used to force all necessary values to a known state (e.g., either 0 or 1). However, a challenge in current simulators, is that not all logic elements need to be reset. Some elements can remain in the unknown Boolean state (X) until the element is actually used in the design. One challenge faced by circuit designers is that design compilers and other logic synthesizers can create logic that does not properly reset when simulated due to the unknown Boolean states not properly clearing, even though the circuit design (the Hardware Design Language) and the resulting netlist logic is correct. This is because, once built, the actual hardware circuit will reset properly regardless of whether a logic element powers up high (1) or low (0). However, due to the way that the circuit is design and the way that the simulator handles unknown Boolean states, the simulator does not properly clear the unknown Boolean states. This results in the simulator generating false errors.

A few approaches have been developed to address the aforementioned challenge. A reset signal can be introduced at the last stage of a circuit. However, this approach is problematic because the last stage of a circuit is often on the critical path of the circuit which is often not an optimal place to introduce a reset signal. In a timing-critical circuit, introducing the reset signal at the last stage of the circuit can cause the circuit to miss timing requirements. Another approach that designers use is to "force" the reset of various unresolved simulated logic element signals in order to avoid false errors from the simulator. The forcing is done via the simulator and is not part of the design. The use of these forced reset signals can result in masking actual problems in the circuit design (e.g., where the circuit does not properly power up but the introduction of forced reset signals masks the error in the simulation of the circuit's power up sequence). The designer must be very careful to force only false errors. That approach is error prone because the list of logic elements to force can change each time synthesis is run leaving, the possibility that logic elements on the current list should not be on the next list. Consequently, using this approach the designer needs to ascertain which logic elements need to be both added and removed with each synthesis run.

FIG. 1A is a circuit diagram that depicts how the prior art's handling of unknown Boolean states can cause false errors, especially when simulating the power-on sequence of a circuit. Circuit 100 is a simple circuit where the signal from logic gate 140 is fed back into the circuit. In traditional simulators, the output (Q) from logic gate 140 is initialized to an unknown Boolean state (X). This unknown Boolean state is fed to inverter 110. However, the inverse of an unknown Boolean state is still an unknown Boolean state (X). AND gate 120 receives the output from the inverter (unknown Boolean state (X)) and the reset signal which forces a high value (1) as an input to AND gate 120. However, AND gate 120 outputs another unknown Boolean state when it ANDs the unknown Boolean state with the high (1) state of the reset signal. NOR gate 130 then receives both the output from AND gate 120 and the unknown Boolean state fed from logic gate 140. This causes NOR gate 130 to also output an unknown Boolean state (X) which is fed back to logic gate 140, causing an error.

If circuit 100 were actually built, however, it can be shown that the circuit would properly initialize regardless of whether logic gate 140 randomly initiated to a high (1) state or a low (0) state. When power is applied to circuit, if logic gate 140 is in a high state (1), the high value (1) would be fed to inverter 110 resulting in a low value (0) being fed to AND gate 120 along with the reset signal (1). The AND gate would output a 0 (1 ANDed with 0 being 0). The 0 from AND gate 120 would be fed to NOR gate 130 along with the random high (1) state fed from logic gate 140 resulting in a low value output fed to logic gate 140 (0 NORed with 1 being 0). Likewise, if the circuit powered up to a low (0) state, the 0 would be fed to inverter 110 resulting in a high value (1). The ANDing of the high value (1) with the reset signal (1) at AND gate 120 would result in a high value (1) being output from AND gate 120 and fed to NOR gate 130. NOR gate 130 receives the high value (1) from AND gate 120 and the random low (0) state fed from logic gate 140. Once again, the NOR of the 1 and the 0 would result in a 0 being fed to logic gate 140. In other words, while the simulator indicated an error condition during power up, the actual circuit would properly power up regardless of the random value initially output from logic gate 140.

SUMMARY

It has been discovered that the aforementioned challenges are resolved using a design structure that simulates a circuit design using both an unknown Boolean state and a negative unknown Boolean state. When the circuit is simulated, one or more initial simulated logic elements are initialized to the unknown Boolean state. The initialized unknown Boolean states are then fed to one or more simulated logic elements and the simulator simulates the handling of the unknown Boolean state by the simulated logic elements. Examples of simulated logic elements include gates and latches, such as flip-flops, inverters, AND gates, OR gates, XOR gates, NAND gates, NOR gates, and XNOR gates. The processing results in at least one negative unknown Boolean state. An example of when a negative unknown Boolean state would result would be when the unknown Boolean state is inverted by an inverter. The resulting negative unknown Boolean state is then fed to other simulated logic elements that generate further simulation results based on processing the negative unknown Boolean state.

The simulated logic elements that process the unknown Boolean state in order to generate the negative unknown Boolean state can include more than one interconnected simulated logic elements with some of the interconnected simulated logic elements being simulated during a first simulated clock cycle and other interconnected simulated logic elements simulated during subsequent simulated clock cycles.

In one embodiment, the results of processing the unknown Boolean state and the negative unknown Boolean state are found by looking up the results in truth tables. A different truth table corresponds to each of the various simulated logic elements handled by the simulator.

In one embodiment, the initialized unknown Boolean states are associated with a source tag that corresponds to the initialized simulated logic element. In other words, the source tag acts as a pointer to a particular simulated logic element where an unknown Boolean state was initialized. In this embodiment, when unknown Boolean states are fed to a downstream simulated logic element, the source tags are compared to determine if the unknown Boolean states can be combined using the simulated logic element. If the unknown Boolean states can be combined, the simulated resulting value is output (e.g., by looking up the result in a truth table). The result can be an unknown Boolean state, a negative unknown Boolean state, or a known signal (e.g., a high value (1), a low value (0), etc.). On the other hand, if the unknown Boolean states have different source tags, the unknown Boolean states cannot be combined. Instead, the simulated result is set to another unknown Boolean state and the source tag is set to an invalid value (e.g., set to Null or to another value that cannot correspond to any simulated logic element).

In one embodiment, one of the initial simulated logic elements includes more than one output where one of the outputs is the inverse of the other output. In this initial simulated logic element, one of the outputs is initialized to the unknown Boolean state and the other output is initialized to the negative unknown Boolean state. The initialized negative unknown Boolean state can then be fed to other simulated logic elements. In an alternative of this embodiment, both the unknown Boolean state and the negative unknown Boolean state are associated with the initial simulated logic element.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 3 is a diagram showing portions of truth tables for basic logic gates incorporating both unknown Boolean states and negative unknown Boolean states with inputs having the same source tags;

FIG. 4 is a diagram showing portions of truth tables for basic logic gates incorporating both unknown Boolean states and negative unknown Boolean states with inputs having different source tags;

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1A:
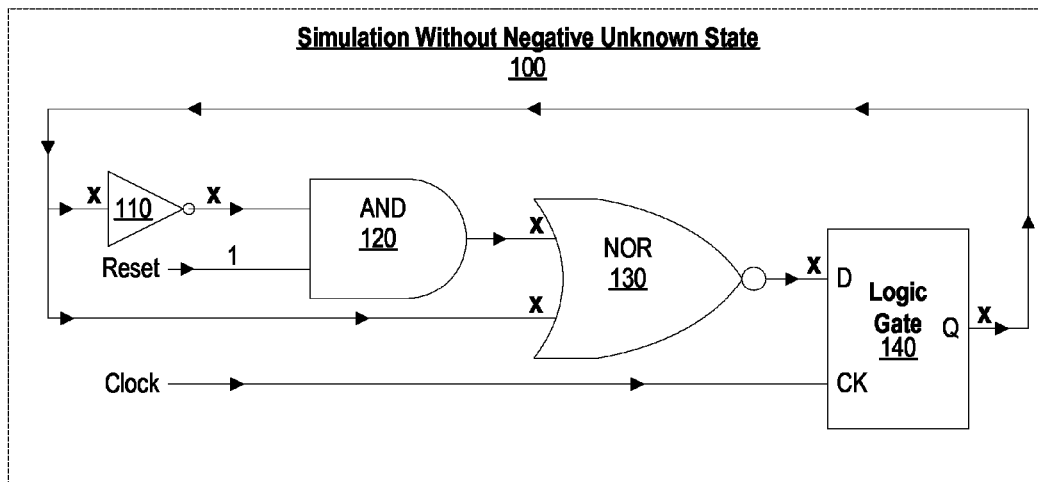
FIG. 1A is a circuit diagram that depicts how the prior art's handling of unknown Boolean states can cause false errors, especially when simulating the power-on sequence of a circuit.

FIG. 1A is a circuit diagram that depicts how the prior art's handling of unknown Boolean states can cause false errors, especially when simulating the power-on sequence of a circuit and was previously described in the Background Section.

Figure 1B:
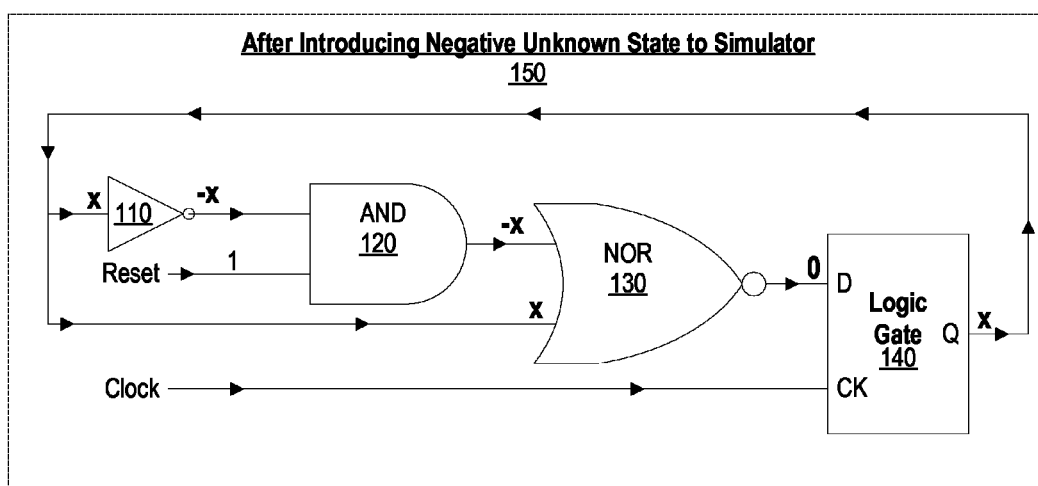
FIG. 1B is a circuit diagram that depicts how using negative unknown Boolean states prevents false errors, especially when simulating the power-on sequence of a circuit.

FIG. 1B is a circuit diagram that depicts how using negative unknown Boolean states prevents false errors, especially when simulating the power-on sequence of a circuit. Circuit design 150 is identical to circuit design 100 shown in FIG. 1A. However, unlike the prior art's handling of unknown Boolean states shown in FIG. 1A, negative unknown Boolean states are used in circuit design 150, as described below.

Like prior art simulated circuit 100, when the simulator simulates applying power to circuit 150, logic gate 140 is initialized to unknown Boolean state (X). The initialized unknown Boolean state is fed back through inverter 110. However, unlike the prior art's handling of inverting the unknown Boolean state, inverter 110 outputs a negative unknown Boolean state (−X). This indicates that even though the output of inverter 110 is unknown, its value is the Boolean opposite of the value that was input to the inverted. AND gate 120 receives the negative unknown Boolean state and the reset signal (1). AND gate 120 ANDs the negative unknown Boolean state (−X) and the reset signal (1), resulting in a negative unknown Boolean state (−X) as the output. The negative unknown Boolean state (−X) from AND gate 120 is fed to NOR gate 130 along with an initialized unknown Boolean state (X) fed from initialized logic gate 140. NOR gate 130 NORs the negative unknown Boolean state (−X) with the unknown Boolean state (X) resulting in a zero (0) which is output and fed back to logic gate 140. The output of NOR gate 130 resolves to a zero (0) because its input of X and −X mean that its inputs are 0 and 1 even though it cannot be determined which input is 0 and which input is 1. Thus, simulated circuit 150 properly initializes from a simulated power-on condition, where, in contrast, the prior art's simulation of the same circuit (without using the negative unknown Boolean state, (X)), resulted in a simulation error when logic gate 140 received a unknown Boolean state (X) as input during simulation of power being applied to the circuit.

Likewise, logic gate 140 could also be initialized to the negative unknown Boolean state (−X) which would also result in logic gate 140 being properly initialized. In the case where logic gate 140 is initialized to the negative unknown Boolean state (−X), inverter 110 outputs an unknown Boolean state (X) which is fed to AND gate 120 resulting in an AND of an unknown Boolean state (X) and the reset signal (1). The result of AND gate 120 would be an unknown Boolean state (X) which is fed to NOR gate 130 along with the initialized negative unknown Boolean state fed from initialized logic gate 140. Once again, NOR gate 130, receiving both a negative unknown Boolean state and an unknown Boolean state, results in a zero (0) that is fed to logic gate 140 and, once again, logic gate 140 is properly initialized.

Figure 2:
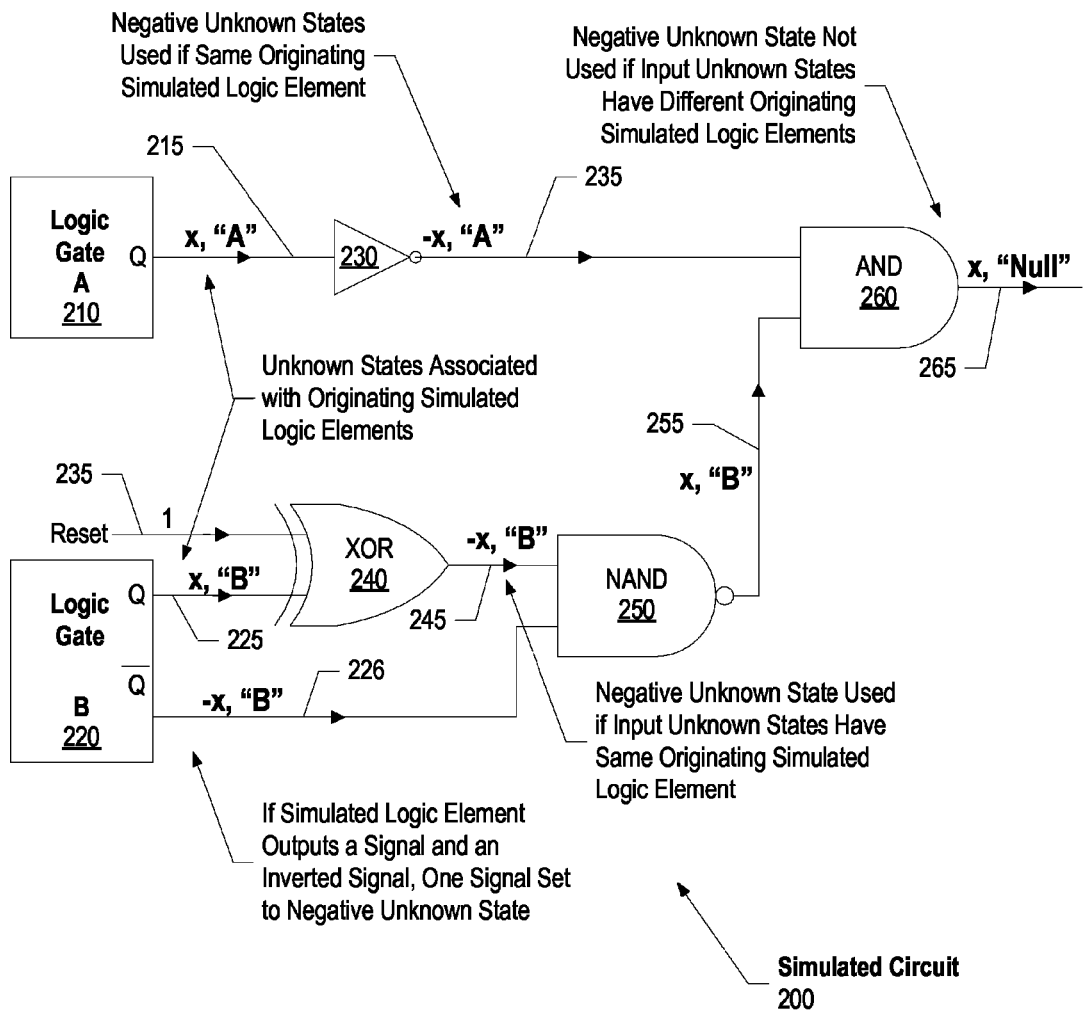
FIG. 2 is a circuit diagram showing how the origination of unknown Boolean states is tracked by the simulator in order to properly combine unknown Boolean states.

FIG. 2 is a circuit diagram showing how the origination of unknown Boolean states is tracked by the simulator in order to properly combine unknown Boolean states. In cases where multiple simulated logic elements are initialized, such as logic gates 210 and 220, the source gate where the unknown Boolean state (or negative unknown Boolean state) was initialized is associated with the state in order to determine if unknown Boolean states and/or negative unknown Boolean state can be properly combined at a given simulated logic element. As previously mentioned, examples of simulated logic elements include gates and latches, such as flip-flops, inverters, AND gates, OR gates, XOR gates, NAND gates, NOR gates, and XNOR gates. The association of a source tag with the initialized unknown Boolean states better represents, and simulates, the actual performance of the circuit. In other words, if one actual logic element, such as a logic gate, is randomly initialized to either a high value (1) or a low value (0) and it is combined with the randomly initialized value of another logic element, it cannot be ascertained if both randomly initialized values are the same and, indeed, there is a 50% chance that they are not the same value. In order to simulate this condition, a source tag, such a pointer to the simulated logic element (e.g., a logic gate), is associated with the initialized state (e.g., an unknown Boolean state (X) or a negative unknown Boolean state (−X)).

Simulated circuit 200 depicts the association of source tags with initialized states. Logic gate 210 is labeled "A". When power is simulated as being applied to circuit 200, logic gate 210 initializes to an unknown Boolean state which is output as signal 215. Note that, in addition to the unknown Boolean state (X), a source tag is also output in signal 215. The source tag associates the unknown Boolean state with the simulated logic element where the unknown Boolean state was initialized. In this case, the unknown Boolean state is associated with simulated logic element 210 (logic gate "A").

Logic gate 220 shows an example of a gate that is initialized with multiple unknown Boolean states. In the case of logic gate 220, two outputs (Q and Q bar) are shown, with Q bar being an inverse of Q. When power is simulated as being applied to the circuit, logic gate 220 initializes to an unknown Boolean state which is output through Q as signal 225. In addition to the unknown Boolean state, signal 225 includes a source tag that associates the unknown Boolean state with the simulated logic element where the unknown Boolean state was initialized (in this case, the simulated logic element is logic gate "B" 220). The second output of logic gate "B" (220) is noted as Q bar (the inverse of Q). This output is initialized as the inverse of the unknown Boolean state, or, in other words, a negative unknown Boolean state. In addition to the negative unknown, signal 226 also includes a source tag that associates the unknown Boolean state (in this case a negative unknown Boolean state) with the originating simulated logic element (in this case, logic gate "B" (220)).

Returning to signal 215, this signal is fed to inverter 230 which, in turn, outputs signal 235. Note that the unknown Boolean state output from inverter 230 is a negative unknown Boolean state (the inverse of an unknown Boolean state being a negative unknown Boolean state, see the truth tables in FIG. 3 for details of how unknown Boolean state and negative unknown Boolean state are handled by logical operations such as simple gates and inverters when both inputs have the same source tags). Note that signal 235 is also associated with logic gate "A" (210) because logic gate 210 was the simulated logic element that initialized the unknown Boolean state.

Turning now to signal 225, the circuit shows signal 225 being fed to XOR gate 240 along with Reset Signal 235 (the reset signal being a forced high (1) value). XOR gate 240 combines the unknown Boolean state (X) from signal 225 with the reset signal (1) resulting in a negative unknown Boolean state that is output as signal 245. Note again that signal 245 also associates the unknown Boolean state (in this case a negative unknown Boolean state) with the simulated logic element where the unknown Boolean state was first initialized (in this case, logic gate "B" (220)). Signal 245 is shown being fed to NAND gate 250 along with signal 226. Therefore, as shown, NAND gate 250 NANDs the negative unknown Boolean state from signal 226 with the negative unknown Boolean state from signal 245. This results in the unknown Boolean state being (X) output from NAND gate 250 as signal 255. NAND gate 250 was able to combine the two unknown Boolean states (in this case, an unknown Boolean state and a negative unknown Boolean states because each of the unknown Boolean states fed to NAND gate 250 had the same source tag (in this case, both unknown Boolean states originated from logic gate "B" 220). Signal 255, output from NAND gate 250, is the unknown Boolean state (X) and includes a source tag that associates this unknown Boolean state with the simulated logic element that initialized the unknown Boolean state (in this case, logic gate "B" (220)).

Turning now to AND gate 260, the circuit shows that this AND gate is fed by signals 235 and 255. As described above, signal 235 is a negative unknown Boolean state (−X) that originated at logic gate "A", and signal 255 is the unknown Boolean state (X), however signal 255 originated from logic gate "B". Because the source tags of the two signals are not the same, the signals cannot be properly combined. Therefore AND gate 260 outputs signal 265 that is an unknown Boolean state (X) that has an invalid source tag. In one embodiment, when an unknown Boolean state has no source tag associated with it, the source tag is set to "Null". In other words, when two unknown Boolean states (either unknown Boolean states or negative unknown Boolean states) are encountered, the truth tables shown in FIG. 3 are not followed and, instead, the truth tables in FIG. 4 are used. The truth tables in FIG. 4 are used when any input to a simulated logic element is invalid (e.g., the source tag for any one of the input is 'Null'), or, as in this case, when the source tags for the unknown inputs are not the same. Looking at the AND truth table in FIG. 4, when the inputs are –X and X the result is the unknown Boolean state (X). Note also that the source tag for output signal 265 is 'Null' (invalid), indicating that output signal 265 is not associated with any particular simulated logic element. If the unknown Boolean state of output signal 265 is processed by another simulated logic element, the truth tables shown in FIG. 4 would again be used.

FIG. 3 is a diagram showing portions of truth tables for basic logic gates incorporating both unknown Boolean states and negative unknown Boolean states when the inputs have the same source tags. Truth tables 300 include some truth tables for basic logic gates. Note that inputs that do not involve at least one unknown Boolean state (or negative unknown Boolean state) as an input have been left off of the truth tables. For example, in inverter truth table 310, the inverse of an unknown Boolean state is shown being a negative unknown Boolean state and the inverse of a negative unknown Boolean state is shown being an unknown Boolean state. However while the inverse of a high value (1) is a low value (0), and conversely, the inverse of a low value (0) is a high value (1), these combinations are not shown in inverter truth table 310 as these are well known by those of skill in the art. Truth tables 300 includes AND gate truth table 320, OR gate truth table 330, NAND gate truth table 340, NOR gate truth table 350, XOR gate truth table 360, and XNOR gate truth table 370.

Figure 6:
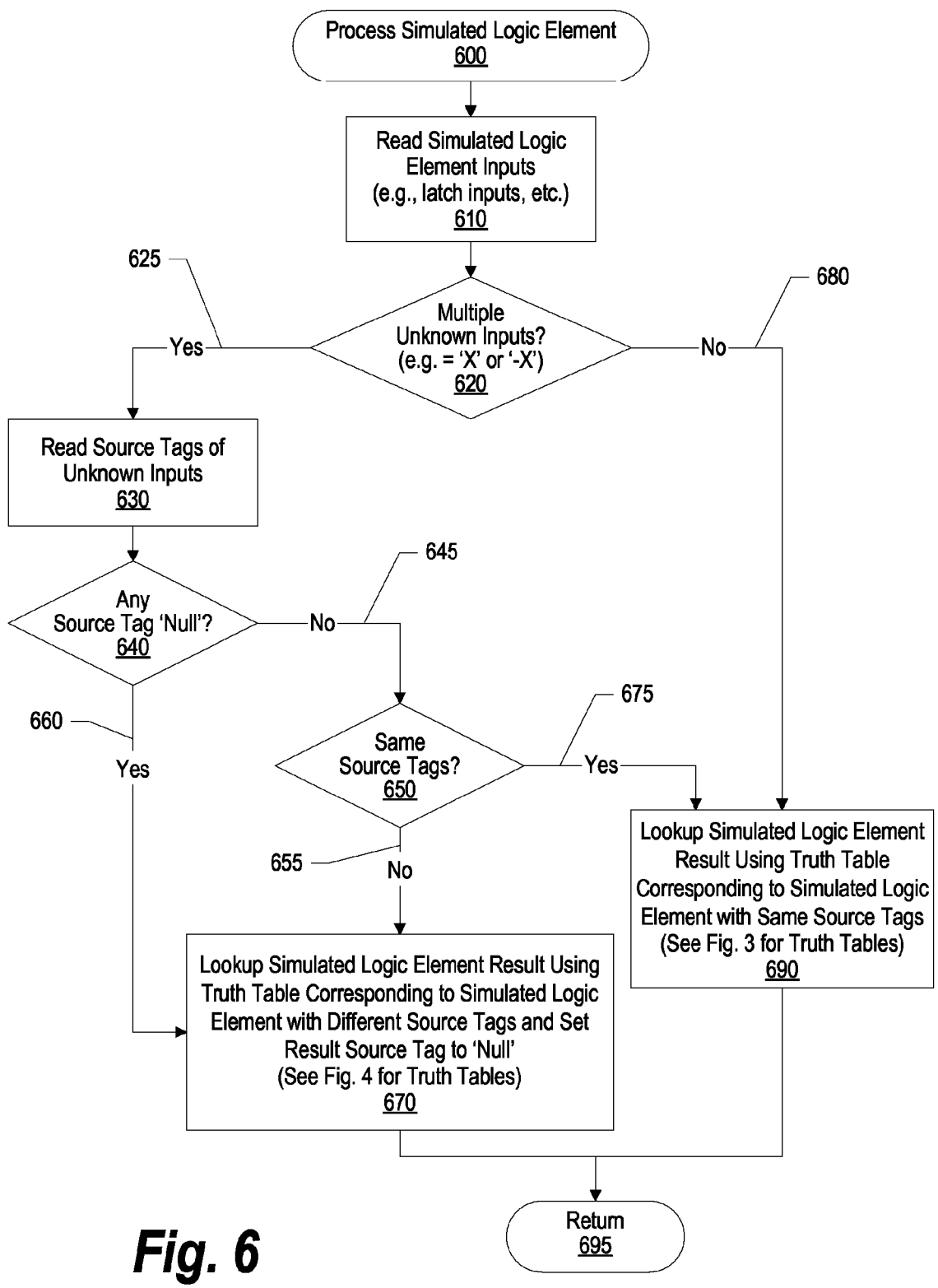
FIG. 6 is a flowchart showing steps taken by the simulator to process a logic element including logic for handling unknown and negative unknown Boolean states.

FIG. 4 is a diagram showing portions of truth tables for basic logic gates for inputs of both unknown Boolean states and negative unknown Boolean states when the inputs have different source tags or when any of the inputs have a 'Null' source tag (indicating that the input is not associated with any simulated logic element). Truth tables 400 include some truth tables for basic logic gates. Note that inputs that do not involve at least one unknown Boolean state (or negative unknown Boolean state) as an input have been left off of the truth tables. Note also that because a correlation does not exist between inputted unknown states (because the inputs have different source tags), resulting values are either the unknown state (X) or a known value (e.g., 0 or 1). In addition, as shown in FIG. 6 below, the source tag for any unknown state result will be an invalid tag (e.g., a Null value) indicating that the result is not associated with any initial simulated logic element. Truth tables 400 includes inverter gate truth table 410, AND gate truth table 420, OR gate truth table 430, NAND gate truth table 440, NOR gate truth table 450, XOR gate truth table 460, and XNOR gate truth table 470.

Figure 5:
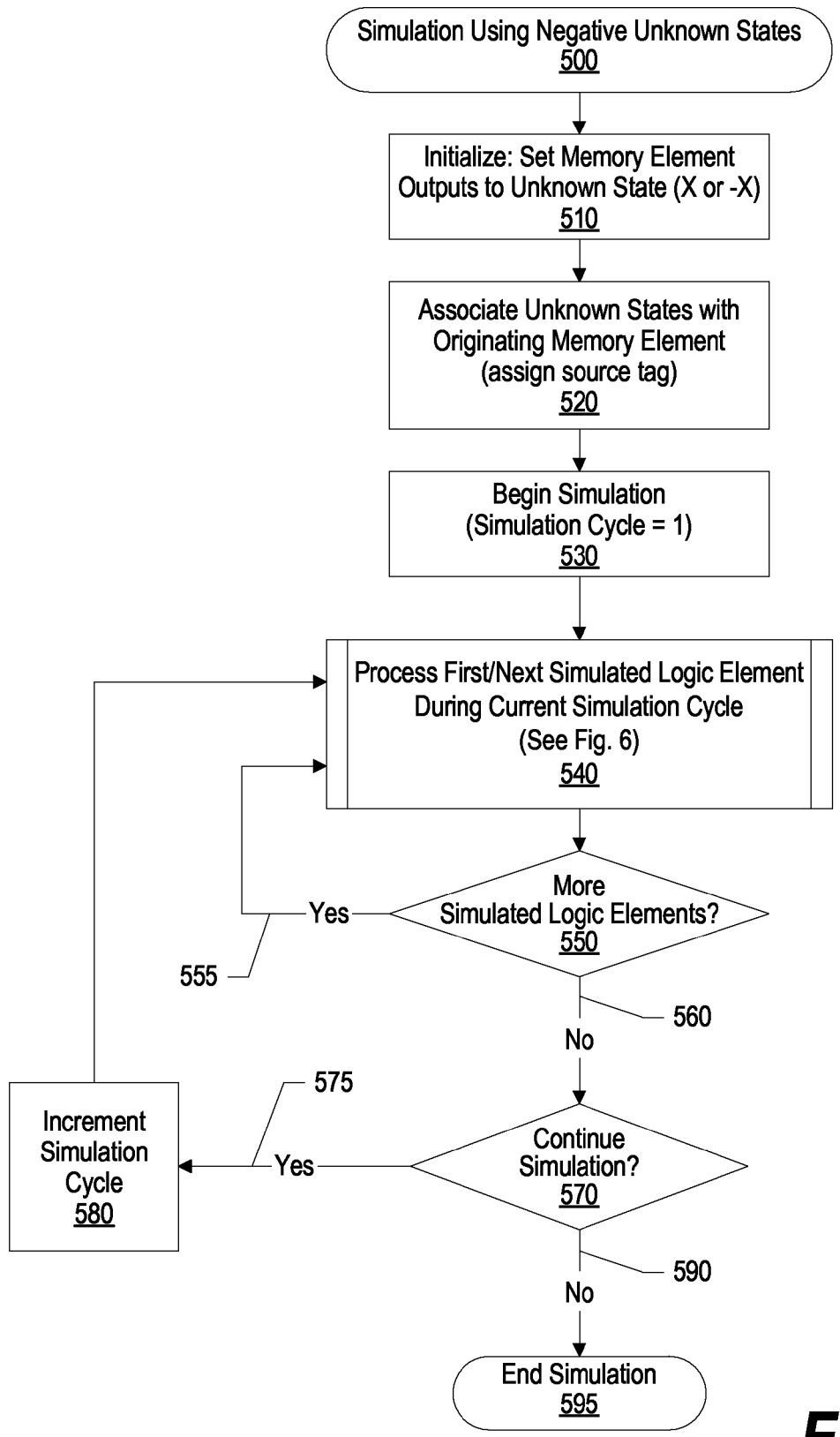
FIG. 5 is a flowchart showing steps taken by a simulator to manage unknown and negative unknown Boolean states.

FIG. 5 is a flowchart showing steps taken by a simulator to manage unknown and negative unknown Boolean states. Processing commences at 500 whereupon, at step 510, output values of simulated logic elements are initialized to either the unknown Boolean state or the negative unknown Boolean state. Simulated logic elements that are initialized are memory elements that store a value. In one embodiment, a given simulated logic element can include both an output and an inverted output (e.g., Q and Q bar). An unknown Boolean state is then assigned as one output and a negative unknown Boolean state is assigned as the other output. At step 520, the unknown Boolean states (unknown Boolean state or negative unknown Boolean state values) are associated with the simulated logic element where the unknown Boolean state was initialized. Simulation commences at step 530 with the simulation cycle being initialized (e.g., initialized to "1"). At predefined process 540, the first simulated logic element is simulated (see FIG. 6 and corresponding text for processing details). A determination is made as to whether there are more simulated logic elements to simulate during the cycle that is being simulated (decision 550). If there are more simulated logic elements to simulate during the current simulation cycle, decision 550 branches to "yes" branch 555 which loops back to process (simulate) the next simulated logic element. This looping continues until all simulated logic elements have been processed for the current simulation cycle, at which point decision 550 branches to "no" branch 560.

After all simulated logic elements in the current simulation cycle have been processed, a determination is made as to whether simulation should continue (decision 570). If simulation is continuing, decision 570 branches to "yes" branch 575 whereupon, at step 580, the simulation cycle is incremented (e.g., from "1" to "2", etc.) and processing loops back to process all the simulated logic elements that occur during this simulation cycle. This looping continues until simulation is finished, at which point decision 570 branches to "no" branch 590 and the simulation ends at 595.

FIG. 6 is a flowchart showing steps taken by the simulator to process a simulated logic element including logic for handling unknown and negative unknown Boolean states. The processing shown in FIG. 6 is performed when a simulated logic element is encountered during simulation and commences at 600. At step 610, the simulated logic element inputs are read (e.g., the signals that are fed to the simulated logic element). At decision 620, a determination is made as to whether there are multiple unknown Boolean states (unknown Boolean states or negative unknown Boolean states). If there are multiple unknown Boolean states, decision 620 branches to "yes" branch 625 whereupon, at step 630, the source tags associated with the unknown Boolean states are read. At decision 640, a determination is made as to whether any of the source tags are invalid (e.g., "Null"), indicating that the truth tables shown in FIG. 3 cannot be used to combine the unknown Boolean states. If any of the input values are invalid ("Null"), then decision 640 branches to "no" branch 645 whereupon another determination is made as to whether the source tags are the same (decision 650). If the source tags are the same, then the unknown Boolean states can be combined using the truth tables shown in FIG. 3 and decision 650 branches to "yes" branch 675 whereupon, at step 690, the resulting output value is retrieved from the truth tables that handle unknown Boolean state inputs with the same source tags (e.g., FIG. 3). On the other hand, if the source tags are not the same (indicating that the unknown Boolean states originated from different simulated logic elements), then decision 650 branches to "no" branch 655 whereupon, at step 670, the truth tables that combine inputs with different source tags (e.g., FIG. 4) is used to retrieve the result and the resulting source tag is set to an invalid state (e.g., 'Null'). Returning to decision 640, of either (or both) of the source tags for the unknown Boolean states being fed to the latch is already a "Null" (invalid) value, then decision 640 branches to "yes" branch 660 whereupon step 670 is performed (see above description of step 670). Returning to decision 620, if there are not multiple unknown Boolean states being input to the latch, decision 620 branches to "no" branch 680 whereupon, at step 690, the latch result that is output is retrieved from the truth tables shown in FIG. 3 that handle inputs of unknown Boolean states and negative unknown Boolean states with the same source tags. Here, of course, no more than one of the inputs would be an unknown Boolean state (either the unknown Boolean state or the negative unknown Boolean state). Processing thereafter returns to the calling routine (e.g., the processing shown in FIG. 5) at 695.

Figure 7:
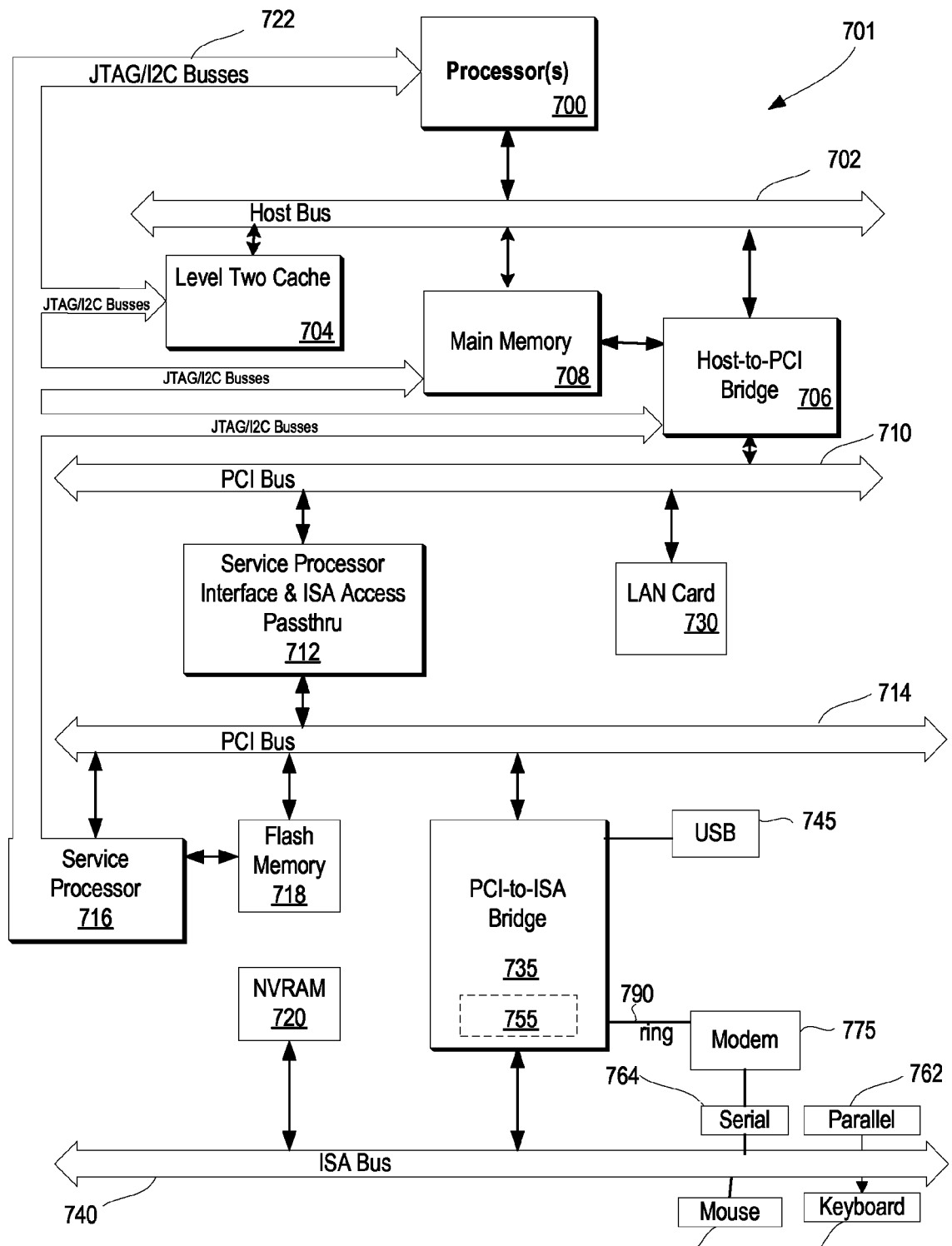
FIG. 7 is a block diagram of a computing device capable of implementing the present invention.

FIG. 7 illustrates information handling system 701 which is a simplified example of a computer system capable of performing the computing operations described herein. Computer system 701 includes processor 700 which is coupled to host bus 702. A level two (L2) cache memory 704 is also coupled to host bus 702. Host-to-PCI bridge 706 is coupled to main memory 708, includes cache memory and main memory control functions, and provides bus control to handle transfers among PCI bus 710, processor 700, L2 cache 704, main memory 708, and host bus 702. Main memory 708 is coupled to Host-to-PCI bridge 706 as well as host bus 702. Devices used solely by host processor(s) 700, such as LAN card 730, are coupled to PCI bus 710. Service Processor Interface and ISA Access Pass-through 712 provides an interface between PCI bus 710 and PCI bus 714. In this manner, PCI bus 714 is insulated from PCI bus 710. Devices, such as flash memory 718, are coupled to PCI bus 714. In one implementation, flash memory 718 includes BIOS code that incorporates the necessary processor executable code for a variety of low-level system functions and system boot functions.

PCI bus 714 provides an interface for a variety of devices that are shared by host processor(s) 700 and Service Processor 716 including, for example, flash memory 718. PCI-to-ISA bridge 735 provides bus control to handle transfers between PCI bus 714 and ISA bus 740, universal serial bus (USB) functionality 745, power management functionality 755, and can include other functional elements not shown, such as a real-time clock (RTC), DMA control, interrupt support, and system management bus support. Nonvolatile RAM 720 is attached to ISA Bus 740. Service Processor 716 includes JTAG and I2C busses 722 for communication with processor(s) 700 during initialization steps. JTAG/I2C busses 722 are also coupled to L2 cache 704, Host-to-PCI bridge 706, and main memory 708 providing a communications path between the processor, the Service Processor, the L2 cache, the Host-to-PCI bridge, and the main memory. Service Processor 716 also has access to system power resources for powering down information handling device 701.

Peripheral devices and input/output (I/O) devices can be attached to various interfaces (e.g., parallel interface 762, serial interface 764, keyboard interface 768, and mouse interface 770 coupled to ISA bus 740. Alternatively, many I/O devices can be accommodated by a super I/O controller (not shown) attached to ISA bus 740.

In order to attach computer system 701 to another computer system to copy files over a network, LAN card 730 is coupled to PCI bus 710. Similarly, to connect computer system 701 to an ISP to connect to the Internet using a telephone line connection, modem 775 is connected to serial port 764 and PCI-to-ISA Bridge 735.

While FIG. 7 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

Figure 8:
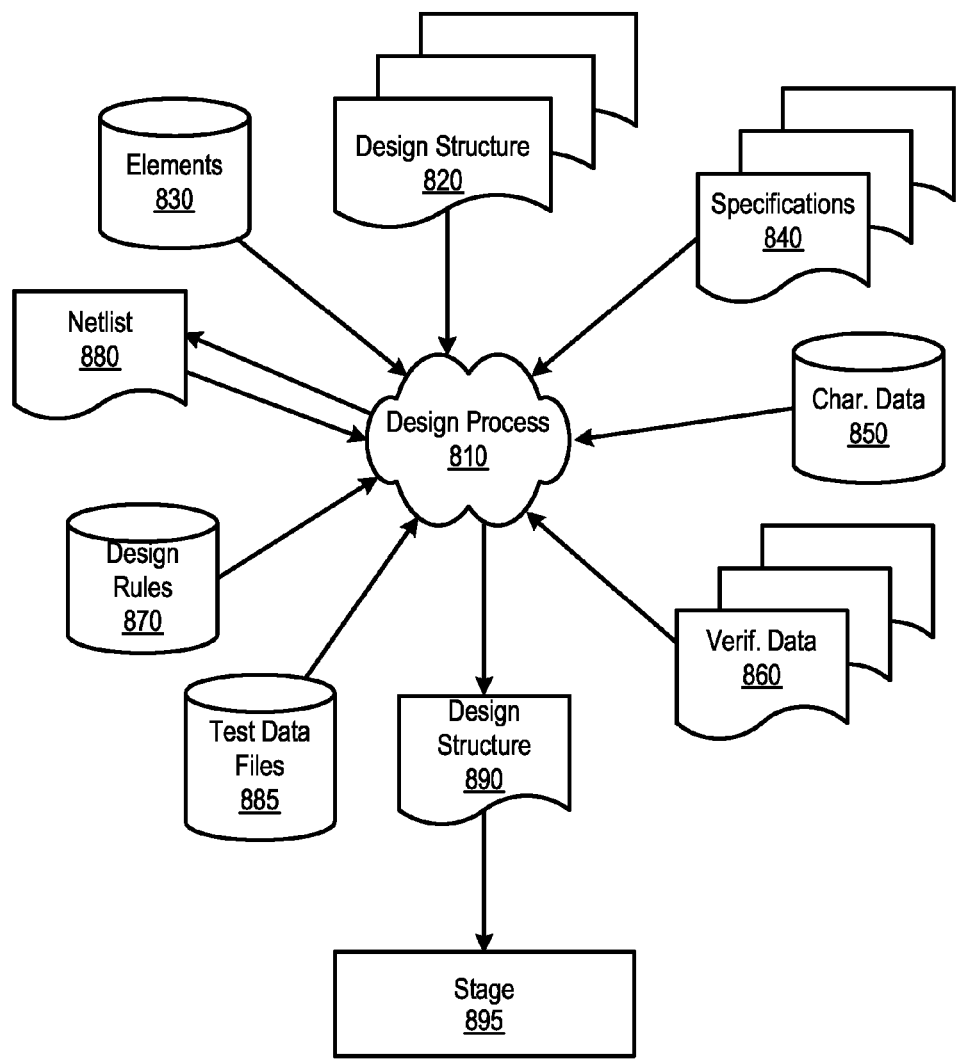
FIG. 8 is a diagram illustrating multiple design structures.

FIG. 8 illustrates multiple such design structures including an input design structure 820 that is preferably processed by a design process 810. Design structure 820 may be a logical simulation design structure generated and processed by design process 810 to produce a logically equivalent functional representation of a hardware device. Design structure 820 may also or alternatively comprise data and/or program instructions that when processed by design process 810, generate a functional representation of the physical structure of a hardware device. Whether representing functional and/or structural design features, design structure 820 may be generated using electronic computer-aided design (ECAD) such as implemented by a core developer/designer. When encoded on a machine-readable data transmission or storage medium, design structure 820 may be accessed and processed by one or more hardware and/or software modules within design process 810 to simulate or otherwise functionally represent an electronic component, circuit, electronic or logic module, apparatus, device, or system such as those shown in FIGS. 1 and 2. As such, design structure 820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 810 preferably employs and incorporates hardware and/or software modules for synthesizing, translating, or otherwise processing a design/simulation functional equivalent of the components, circuits, devices, or logic structures shown in FIGS. 1 and 2 to generate a netlist 880 which may contain design structures such as design structure 820. Netlist 880 may comprise, for example, compiled or otherwise processed data structures representing a list of wires, discrete components, logic gates, control circuits, I/O devices, models, etc. that describes the connections to other elements and circuits in an integrated circuit design. Netlist 880 may be synthesized using an iterative process in which netlist 880 is resynthesized one or more times depending on design specifications and parameters for the device. As with other design structure types described herein, netlist 880 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 810 may include hardware and software modules for processing a variety of input data structure types including netlist 880. Such data structure types may reside, for example, within library elements 830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 840, characterization data 850, verification data 860, design rules 870, and test data files 885 which may include input test patterns, output test results, and other testing information. Design process 810 may further include modules for performing standard circuit design processes such as timing analysis, verification, design rule checking, place and route operations, etc.

Design process 810 employs and incorporates well-known logic and physical design tools such as HDL compilers and simulation model build tools to process design structure 820 together with some or all of the depicted supporting data structures to generate a second design structure 890. Similar to design structure 820, design structure 890 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 2. In one embodiment, design structure 890 may comprise a compiled, executable HDL simulation model that functionally simulates the devices shown in FIGS. 1 and 2.

Design structure 890 may also employ a data format used for the exchange of layout data of integrated circuits and/or symbolic data format (e.g. information stored in a GDSII (GDS2), GL1, OASIS, map files, or any other suitable format for storing such design data structures). Design structure 890 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 1 and 2. Design structure 890 may then proceed to a stage 895 where, for example, design structure 890: proceeds to tape-out, is released to manufacturing, is released to a mask house, is sent to another design house, is sent back to the customer, etc.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A method in a computer-aided design system for generating a functional design model of a negative unknown Boolean state, said method comprising:
    generating a functional computer-simulated representation of initializing one or more initial simulated logic elements to an unknown Boolean state;
    generating a functional computer-simulated representation of feeding the unknown Boolean state to one or more first simulated logic elements;
    generating a functional computer-simulated representation of simulating one or more first results resulting from the first simulated logic elements, the first results including at least one negative unknown Boolean state, wherein the negative unknown Boolean state is the opposite of the unknown Boolean state;
    generating a functional computer-simulated representation of feeding the negative unknown Boolean state to one or more second simulated logic elements; and
    generating a functional computer-simulated representation of simulating one or more second results resulting from the second simulated logic elements.

2. The method of claim 1 wherein the simulating of the first and second results further comprises:
    generating a functional computer-simulated representation of looking up the first and second results in one or more truth tables, wherein each of the truth tables corresponds to a different simulated logic element.

3. The method of claim 1 further comprising:
    generating a functional computer-simulated representation of associating a source tag with each of the initialized unknown Boolean states, the source tags each corresponding to a different initial simulated logic elements;
    generating a functional computer-simulated representation of feeding a first of the initialized unknown Boolean states associated with a first source tag and a second of the initialized unknown Boolean states associated with a second source tag to a selected simulated logic element selected from the group consisting of the first simulated logic elements and the second simulated logic elements;
    in response to the first source tag being equal to the second source tag:
        generating a functional computer-simulated representation of looking up the first result in a first truth table that is used when inputs have the same source tag and corresponds to the selected simulated logic element; and
        generating a functional computer-simulated representation of setting the first result's source tag to be equal to the first source tag and the second source tag; and
    in response to the first source tag being unequal to the second source tag:
        generating a functional computer-simulated representation of looking up the first result in a second truth table that is used when inputs have different same source tags or invalid source tags and corresponds to the selected simulated logic element; and
        generating a functional computer-simulated representation of setting the first result's source tag to be invalid.

4. The method of claim 1 wherein the first simulated logic elements include a plurality of interconnected simulated logic elements, wherein one or more of the plurality of interconnected simulated logic elements is simulated during a first simulated clock cycle and wherein one or more of the plurality of interconnected simulated logic elements is simulated during a subsequent simulated clock cycle.

5. The method of claim 1 further comprising:
    generating a functional computer-simulated representation of initializing a first output of a first of the initial simulated logic elements to the unknown Boolean state and a second output of the first initial simulated logic element to the negative unknown Boolean state.

6. The method of claim 5 further comprising:
    generating a functional computer-simulated representation of feeding the initialized negative unknown Boolean state to at least one of the first simulated logic elements.

7. The method of claim 6 further comprising:
    generating a functional computer-simulated representation of associating both the unknown Boolean state and negative unknown Boolean state output by the first initial simulated logic element with the first initial simulated logic element.

8. A design structure embodied in a non-transitory machine readable storage medium for designing, manufacturing, or testing an integrated circuit, the design structure comprising:
one or more program instructions;
one or more initial simulated logic elements initialized to an unknown Boolean state;
one or more first simulated logic elements that are fed with the unknown Boolean state;
one or more first results resulting from the first simulated logic elements, the first results including at least one negative unknown Boolean state, wherein the negative unknown Boolean state is the opposite of the unknown Boolean state;
one or more second simulated logic elements which are fed with the negative unknown Boolean state; and
one or more second results resulting from the second simulated logic elements.

9. The design structure of claim 8 wherein the simulating of the first and second results further comprises:
one or more truth tables used to look up the first and second results, wherein each of the truth tables corresponds to a different simulated logic element.

10. The design structure of claim 8 further comprising:
a source tag associating with each of the initialized unknown Boolean states, the source tags each corresponding to a different initial simulated logic elements;
a first of the initialized which is fed unknown Boolean states associated with a first source tag and a second of the initialized unknown Boolean states associated with a second source tag to a selected simulated logic element selected from the group consisting of the first simulated logic elements and the second simulated logic elements;
in response to the first source tag being equal to the second source tag:
looking up the first result in a first truth table that is used when inputs have the same source tag and corresponds to the selected simulated logic element; and
setting the first result's source tag to be equal to the first source tag and the second source tag; and
in response to the first source tag being unequal to the second source tag:
looking up the first result in a second truth table that is used when inputs have different same source tags or invalid source tags and corresponds to the selected simulated logic element; and
setting the first result's source tag to be invalid.

11. The design structure of claim 8 wherein the first simulated logic elements include a plurality of interconnected simulated logic elements, wherein one or more of the plurality of interconnected simulated logic elements is simulated during a first simulated clock cycle and wherein one or more of the plurality of interconnected simulated logic elements is simulated during a subsequent simulated clock cycle.

12. The design structure of claim 8 further comprising:
a first output of a first of the initial simulated logic elements which is initialized to the unknown Boolean state and a second output of the first initial simulated logic element which is initialized to the negative unknown Boolean state.

13. The design structure of claim 12 further comprising:
feeding the initialized negative unknown Boolean state to at least one of the first simulated logic elements.

14. The design structure of claim 8 wherein the design structure comprises a netlist.

15. The design structure of claim 8 wherein the design structure resides on a storage medium in a data format used for the exchange of layout data of integrated circuits.

16. A hardware description language (HDL) design structure encoded on a non-transitory machine-readable data storage medium, said HDL design structure comprising elements that when processed in a computer-aided design system generates a machine-executable representation of a (device name), wherein said HDL design structure comprises:
a first element processed to generate a functional computer-simulated representation of initializing one or more initial simulated logic elements to an unknown Boolean state;
a second element processed to generate a functional computer-simulated representation of feeding the unknown Boolean state to one or more first simulated logic elements;
a third element processed to generate a functional computer-simulated representation of simulating one or more first results resulting from the first simulated logic elements, the first results including at least one negative unknown Boolean state, wherein the negative unknown Boolean state is the opposite of the unknown Boolean state;
a fourth element processed to generate a functional computer-simulated representation of feeding the negative unknown Boolean state to one or more second simulated logic elements; and
a fifth element processed to generate a functional computer-simulated representation of simulating one or more second results resulting from the second simulated logic elements.

* * * * *